(12) United States Patent
Doesburg et al.

(10) Patent No.: US 7,723,249 B2
(45) Date of Patent: May 25, 2010

(54) CERAMIC MATERIAL FOR HIGH TEMPERATURE SERVICE

(75) Inventors: Jacobus C. Doesburg, Edmonton (CA); Liangde Xie, Pearl River, NY (US); Mitchell Dorfman, Smithtown, NY (US)

(73) Assignee: Sulzer Metco (US), Inc., Westbury, NY (US)

( * ) Notice: Subject to any disclaimer, the term of this patent is extended or adjusted under 35 U.S.C. 154(b) by 0 days.

(21) Appl. No.: 11/520,043

(22) Filed: Sep. 13, 2006

(65) Prior Publication Data

US 2010/0075147 A1 Mar. 25, 2010

Related U.S. Application Data

(60) Provisional application No. 60/724,268, filed on Oct. 7, 2005.

(51) Int. Cl.
- C04B 35/486 (2006.01)
- C04B 35/488 (2006.01)
- B32B 18/00 (2006.01)

(52) U.S. Cl. .................. 501/103; 428/325; 428/701; 428/702

(58) Field of Classification Search ............... 501/103; 428/325, 633, 697, 701, 702, 134, 656, 655, 428/660
See application file for complete search history.

(56) References Cited

U.S. PATENT DOCUMENTS

| | | | | |
|---|---|---|---|---|
| 4,360,598 A * | 11/1982 | Otagiri et al. | ............... | 501/103 |
| 4,520,114 A * | 5/1985 | David | ............... | 501/12 |
| 4,565,792 A * | 1/1986 | Knapp | ............... | 501/104 |
| 4,639,356 A * | 1/1987 | O'Toole et al. | ............. | 423/266 |
| 4,788,045 A * | 11/1988 | Colombet et al. | ............. | 423/85 |
| 4,849,142 A * | 7/1989 | Panda et al. | ............... | 264/40.6 |
| 4,936,745 A * | 6/1990 | Vine et al. | ............... | 415/173.4 |
| 5,015,502 A * | 5/1991 | Strangman et al. | ....... | 427/248.1 |
| 5,073,433 A | 12/1991 | Taylor | | |
| 5,106,794 A * | 4/1992 | Oizumi et al. | ............... | 501/103 |
| 5,418,003 A * | 5/1995 | Bruce et al. | ............... | 427/126.2 |
| 5,780,110 A * | 7/1998 | Schaeffer et al. | ............. | 427/327 |
| 6,042,878 A * | 3/2000 | Bruce | ............... | 427/126.2 |
| 6,123,997 A * | 9/2000 | Schaeffer et al. | ......... | 427/383.7 |
| 6,284,691 B1 * | 9/2001 | Bruce | ............... | 501/103 |
| 6,812,176 B1 * | 11/2004 | Zhu et al. | ............... | 501/102 |
| 6,869,550 B2 * | 3/2005 | Dorfman et al. | ............... | 264/5 |
| 6,893,994 B2 | 5/2005 | Wallar | | |
| 6,960,395 B2 * | 11/2005 | Spitsberg et al. | ............ | 428/632 |
| 7,001,859 B2 * | 2/2006 | Zhu et al. | ............... | 501/102 |
| 7,186,466 B2 * | 3/2007 | Zhu et al. | ............... | 428/632 |
| 2005/0238894 A1 * | 10/2005 | Gorman et al. | ............. | 428/469 |
| 2006/0216534 A1 * | 9/2006 | Boutwell et al. | ............ | 428/472 |
| 2007/0274837 A1 * | 11/2007 | Taylor et al. | ............ | 416/241 R |
| 2008/0160172 A1 * | 7/2008 | Taylor et al. | ................... | 427/9 |
| 2008/0220209 A1 * | 9/2008 | Taylor et al. | ................ | 428/134 |

FOREIGN PATENT DOCUMENTS

JP 01179725 * 7/1989

OTHER PUBLICATIONS

European Search Report date Feb. 14, 2007 for European Patent Application No. 06121639.6.
R. Vaβen, N. Czech, W. Malléner, W. Stamm, D. Stöver, "Influence of impurity content and porosity of plasma-sprayed yttria-stabilized zirconia layers on the sintering behaviour", pp. 135-140, Apr. 10, 2000, www.eisevier.nl/locate/surfcoat, Germany.
Robert A. Miller, "Thermal Barrier Coatings for Aircraft Engines—History and Directions", NASA Lewis Research Center Mar. 1995, pp. 17-27, Cleveland, OH.
Lou George, "PRAXAIR Introduces New Yttria-Stabilized Zirconia Powder", p. 22, www.ptihome.com, Spraytime First Quarter 2003.
"Amperit Thermal Spray Powder Catalog," H.C. Starck GmbH, published 2005.
Online Catalog "Product Information Amperit 832 Catalog," H.C. Starck GmbH, at http://www.hcstarck.com/medien/dokumente/document_Produktinfo832.pdf.
"Amperit Thermal Spray Powder Catalog," H.C. Starck, published 1995.

* cited by examiner

*Primary Examiner*—Karl E Group
(74) *Attorney, Agent, or Firm*—Greenblum & Bernstein, P.L.C.

(57) ABSTRACT

The invention is directed to a ceramic material for use in thermal barriers for high temperature cycling applications and high temperature abradable coatings. The material is an alloy formed predominantly from ultra-pure zirconia ($ZrO_2$) and/or hafnia ($HfO_2$) that has uncharacteristically high sintering resistance to achieve a high service lifetime and low thermal conductivity to achieve high operating temperatures. In the material, oxide impurities such as soda ($Na_2O$), silica ($SiO_2$), alumina ($Al_2O_3$), titania ($TiO_2$), hematite ($Fe_2O_3$), calcia (CaO), and magnesia (MgO) make up no more than 0.15 weight percent. The invention provides materials to produce a coating structure so that the changes in the coating microstructure over the in-service lifetime are either limited or beneficial.

18 Claims, 5 Drawing Sheets

CERAMIC MATERIAL FOR HIGH TEMPERATURE SERVICE

CROSS REFERENCE TO RELATED APPLICATIONS

This application claims priority under 35 U.S.C. §119(e) from U.S. Provisional Patent Application No. 60/724,268, filed on Oct. 7, 2005, which is incorporated herein by reference.

STATEMENT REGARDING FEDERALLY SPONSORED RESEARCH OR DEVELOPMENT

Not Applicable

REFERENCE TO A "MICROFICHE APPENDIX"

Not Applicable

BACKGROUND OF THE INVENTION

1. Field of the Invention

The invention relates to ceramic materials for thermal barriers and abradable coating systems in high temperature and high temperature cycling applications, and more particularly to ultra-pure zirconia materials for use in thermal barrier and abradable coating applications.

2. Description of the Related Art

Superior high-temperature properties are required to improve the performance of heat resistant and corrosion resistant members. These members include, for example gas turbine blades, combustor cans, ducting and nozzle guide vanes in combustion turbines and combined cycle power plants. Turbine blades are driven by hot gasses, and the efficiency of the gas turbine increases with the rise in operational temperature. The demand for continued improvement in efficiency has driven the system designers to specify increasingly higher turbine operating temperatures. Thus, there is a continuing need for materials that can achieve higher operational temperatures.

Thermal barrier coatings are used to insulate components, such as those in a gas turbine, operating at elevated temperatures. Thermal barriers allow increased operating temperature of gas turbines by protecting the coated part (or substrate) from direct exposure to the operating environment. An important consideration in the design of a thermal barrier is that the coating be a ceramic material having a crystalline structure containing beneficial cracks and voids, imparting strain tolerance. If there were no cracks in the coating, the thermal barrier would not function, because the differences in thermal expansion between the metal substrate system and the coating will cause interfacial stresses upon thermal cycling that are greater than the bond strength between them. By the creation of a crack network into the coating, a stress relief mechanism is introduced that allows the coating to survive numerous thermal cycles. Repeating crack networks are typically imparted into the coating on varying space scales by manipulating the thermodynamic and kinetic conditions of the manufacturing method, and different structures known to perform the coating task have been optimized likewise. In addition to this, cracks are also formed during service, so the structure formed upon coating manufacture changes with time, depending on the starting material phases in the manufactured coating and thermal conditions during service.

Another design factor determining coating lifetime is the sintering rate of the coating. When the coating is cycled above half of its absolute melting temperature, the coating begins to sinter causing volume shrinkage. As the coating shrinks, the stress difference between the coating and substrate increases. At a certain amount of shrinkage (which varies depending on the type of structure and thermal conditions during service), the stress difference exceeds the bonding strength of the coating and it becomes detached. Decreasing the sintering rate of the thermal barrier increases the amount of time before the catastrophic shrinkage is experienced, so it can become a major design consideration. For high purity zirconia alloys, the onset of sintering commences at temperatures above 1000° C.

Historically, high temperature thermal barrier coatings have been based on alloys of zirconia. Hafnia may also be employed due to its chemical similarity to zirconia, but is generally cost-prohibitive. Hafnia also is typically present in most zirconia materials in more than trace amounts due to difficulty in separating the two oxides. Zirconia and/or hafnia have the following combination of desirable properties that other known ceramic systems do not possesses for the application. First, zirconia alloys have some of the highest melting points of all ceramics, and this means theoretically some of the highest temperatures for which the onset of sintering occurs. Second, zirconia alloys have one of the lowest thermal conductivities of all ceramics. Third, zirconia has one of the highest coefficients of thermal expansion of all ceramics, so it is most compatible with transition metal alloys during thermal cycling.

Zirconia alone cannot fulfill the coating requirements because it undergoes a phase transformation from tetragonal to monoclinic during thermal cycling. This transformation is presumed to cause a detrimental volume change resulting in large strain differences between the coating and the substrate. When the resulting stresses exceed the bond strength of the coating to the substrate, the coating will detach. For this reason a phase stabilizer is added to the zirconia and/or hafnia, such as yttria, which suppresses the tetragonal to monoclinic phase transformation.

Thermal spray abradable coatings are commonly used in gas turbine applications. Abradable coatings are designed to preferentially abrade when contact is made with a mating part. These coatings have low structural integrity so they are readily abraded when they come into contact with a moving surface with higher structural integrity (such as the blade of a turbine). The coatings are designed so as not to damage the mating surface. In many applications abradable coatings are subject to the same thermal cycling conditions as the thermal barriers described above. Thus, there is a continuing need for materials suitable for abradable coatings that can achieve higher operational temperatures.

Some previous efforts to improve coating life have focused on the coating material and microstructure upon entry into service. However, the heat cycle of in service parts also causes cracks throughout the service life of the part. Thus, the microstructure formed upon coating manufacture changes with time, depending on the starting material phases in the manufactured coating and thermal conditions during service. Because a consistent optimal crack network is not typically maintainable throughout the service life of the part, coating lifetime is ultimately determined by the material selection and its manufacturing process. There remains a need in the art for a coating material, coating material manufacturing method, and coating manufacturing method that address the changes in the coating microstructure during its service lifetime.

SUMMARY

Accordingly, the invention is directed to a ceramic material for use in thermal barriers for high temperature cycling applications and high temperature abradable coatings. The material is an alloy formed predominantly from ultra-pure stabilized zirconia ($ZrO_2$) and/or hafnia ($HfO_2$) alloys that have uncharacteristically high sintering resistance to achieve a high service lifetime. The invention provides a desired coating material so that the changes in the coating microstructure over the in-service lifetime are retarded.

The limits for impurities discovered to decrease sintering rate and therefore increase service lifetime compared with current impurity concentrations when used as a coating and partially stabilized with a rare earth oxide, for example, yttria ($Y_2O_3$) and/or ytterbia ($Yb_2O_5$), are disclosed herein. Oxide impurities are defined as materials which, when combined with each other or with zirconia and/or hafnia, form phases with melting points much lower than that of pure zirconia and/or hafnia.

In one aspect, the invention provides a ceramic material for use in high-temperature thermal barriers or abradable seal coatings. The said material has about 4 to 20 weight percent of a stabilizer of one or more rare earth oxides; and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities is less than or equal to 0.15 weight percent.

In another aspect of the invention a blended ceramic material of one or more ceramic materials is provided. Each of the ceramic materials is for use in high-temperature thermal barriers or abradable seal coatings and is supplied in the form of one of a powder or a slurry of partially stabilized powder. Each of the ceramic materials has about 4 to 20 weight percent of a stabilizer of one or more rare earth oxides and a balance of at least one of zirconia ($ZrO_2$), hafnia ($HfO_2$) and combinations thereof, wherein the zirconia ($ZrO_2$) and/or hafnia ($HfO_2$) is partially stabilized by the stabilizer, and wherein the total amount of impurities of the blended ceramic material is less than or equal to 0.15 weight percent. Additional ceramic materials or placeholder materials may also be included in the blended material.

Conventional approaches to improving coating life-cycles have focused on adding stabilizers to the base ceramic material. The approach of the present invention provides previously unexpected results in sintering data by identifying low-impurity materials. When looking at the sintering data, changing the amount of impurities slightly has a much greater effect on performance compared with changing the amount and types of stabilizers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings are included to provide further understanding of the invention and are incorporated in and constitute a part of this specification. The accompanying drawings illustrate embodiments of the invention and together with the description serve to explain the principles of the invention. In the figures.

DETAILED DESCRIPTION OF THE INVENTION

Reference will now be made in detail to the preferred embodiments of the invention, examples of which are illustrated in the accompanying drawings.

Figure 1:
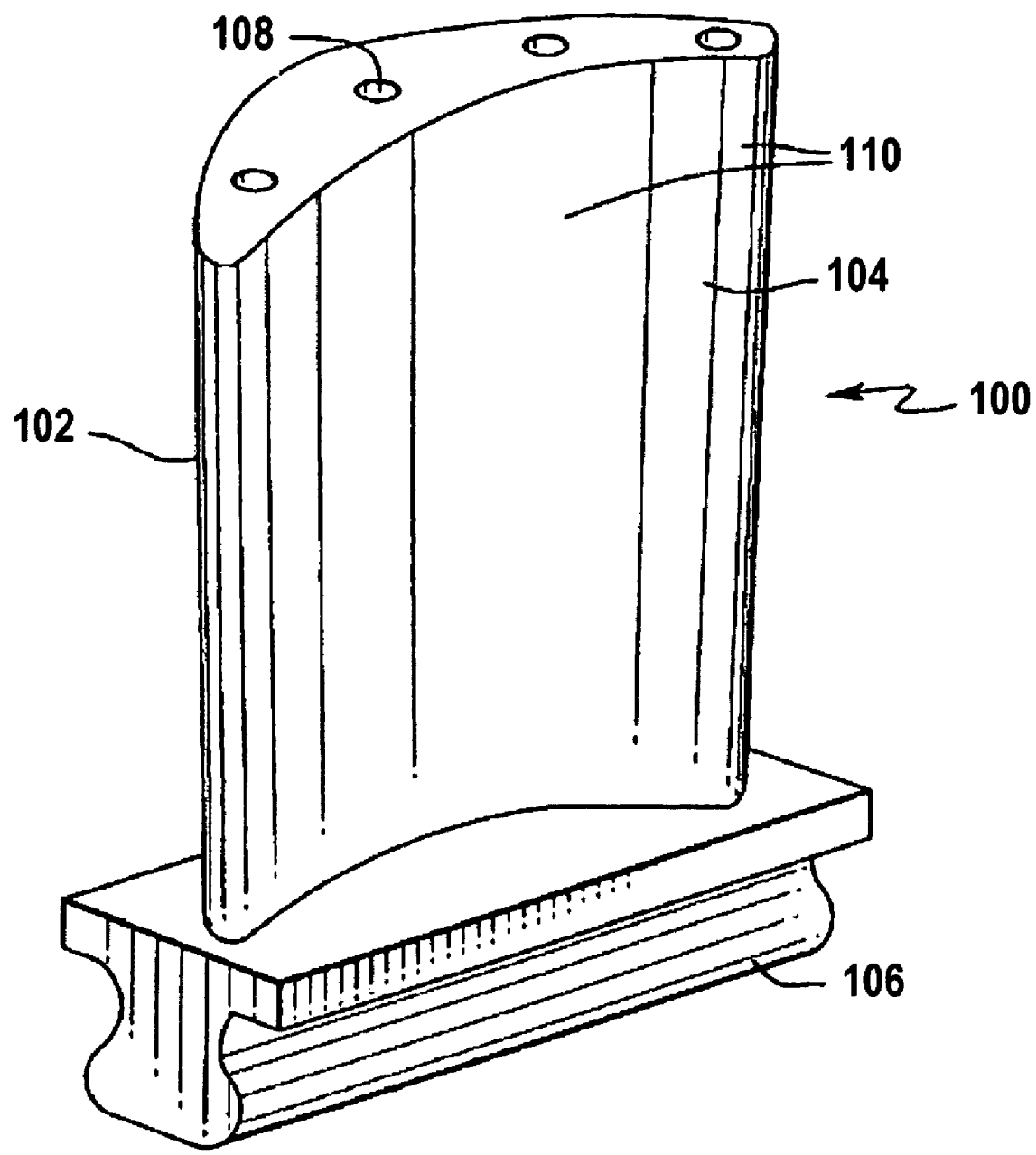
FIG. 1 illustrates a perspective view of a turbine blade coated with a thermal barrier of ceramic material.

In an exemplary use of a material of the invention, FIG. 1 shows one component of a turbine. Turbine blade 100 has a leading edge 102 and an airfoil section 104, against which hot combustion gases are directed during operation of the turbine, and which undergoes severe thermal stresses, oxidation and corrosion. A root end 106 of the blade anchors the blade 100. Venting passages 108 may be included through the blade 100 to allow cooling air to transfer heat from the blade 100. The blade 100 can be made from a high temperature resistant material. The surface of the blade 100 is coated with a thermal barrier coating 110 made of ultra-pure zirconia ($ZrO_2$) and/or hafnia ($HfO_2$) alloys in accordance with the invention. The thermal barrier coating 110 may be applied on, for example, a MCrAlY bonding layer with an alumina scale (not shown) applied between the blade surface and the coating 110. The coating 110 may be applied onto the bond coating surface through a variety of methods known in the art including thermal spray techniques such as powder flame spray and plasma spray and vapor deposition methods such as electron beam physical vapor deposition (EBPVD), high speed physical vapor deposition and low pressure plasma spraying (LPPS).

When applied, the coating 110 contains a crack network that allows it to survive the stress of numerous thermal cycles. As described in the above background section, the crack network is altered to a less desirable state by sintering and temperature cycling during service. Thus the structure formed upon coating manufacture changes with time, the rate depending on the starting material phases. Decreasing the sintering rate increases the amount of time before the closing of microcracks and creation of massive cracks, increasing coating lifetime.

Figure 2:
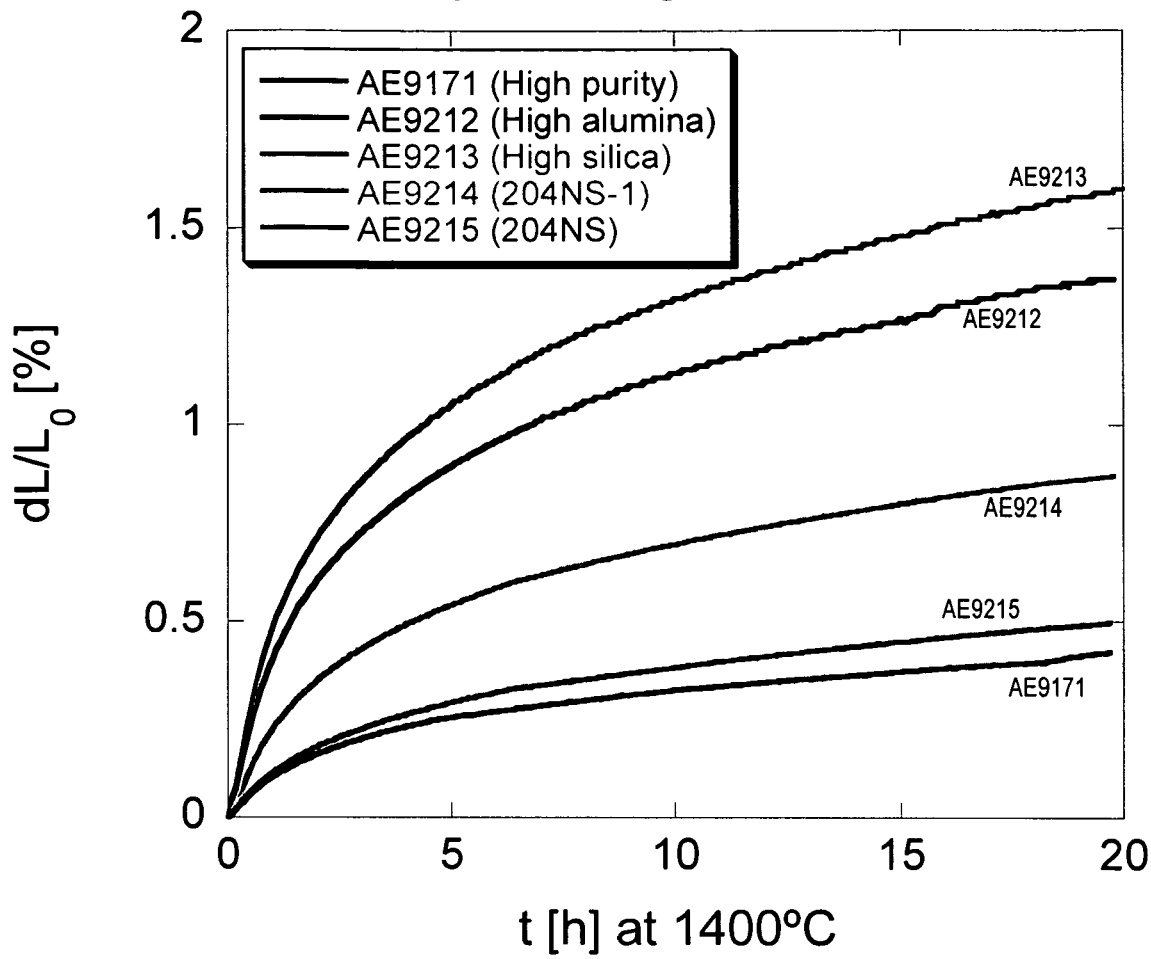
FIG. 2 provides a graph showing the effect of impurities on the sintering rates.

A dominant factor affecting sintering is the presence of specific impurity phases within the structure made up of oxides which when combined with each other or the zirconia alloy result in melting points hundreds of degrees lower than that of the zirconia alloy itself. These impurity oxides increase the sintering rate. FIG. 2 shows the effect of impurity on the sintering rate.

In one embodiment of the present invention, the material contains zirconia ($ZrO_2$) and/or hafnia ($HfO_2$) partially stabilized by a total of 4 to 20 weight percent of one or more rare earth oxides having total impurities less than or equal to 0.15 weight percent, and preferably less than or equal to 0.1 weight percent. For purposes of the invention, rare earth oxides can be defined as any oxide from group IIIB (column 3) of the periodic table of elements, which includes scandia ($Sc_2O_3$), yttria ($Y_2O_3$), lanthanide oxides and actinide oxides.

The material of the present invention contains zirconia ($ZrO_2$) and/or hafnia ($HfO_2$) partially stabilized by a total of 4 to 20 weight percent of a primary stabilizing oxide such as ytterbia and/or yttria, (and optionally additional stabilizers of one or more rare earth oxides) having total impurities less than or equal to 0.15 weight percent, and preferably less than or equal to 0.1 weight percent. For purposes of the present invention, oxide impurities can be defined as materials which when combined with each other or with zirconia form phases with melting points much lower than that of pure zirconia, especially—but not limited to—soda ($Na_2O$), silica ($SiO_2$), and alumina ($Al_2O_3$). Other specific concentration ranges of stabilizers are provided herein and in co-pending and commonly assigned U.S. patent application Ser. No. 11/520,041, entitled "HIGH PURITY CERAMIC ABRADABLE COATINGS," U.S. patent application Ser. No. 11/520,044, entitled "OPTIMIZED HIGH TEMPERATURE THERMAL BARRIER," and U.S. application Ser. No. 11/520,042, entitled "OPTIMIZED HIGH PURITY COATING FOR HIGH TEMPERATURE THERMAL CYCLING APPLICATIONS" each filed on Sep. 13, 2006 and each incorporated herein by reference.

In accordance with embodiments of the invention, the limits for known impurities in order to achieve a desirable sintering rate and therefore increase service lifetime when used as a coating are about:

| | |
|---|---|
| soda ($Na_2O$) | 0.1 weight percent |
| silica ($SiO_2$) | 0.05 weight percent |
| alumina ($Al_2O_3$) | 0.01 weight percent |
| titania ($TiO_2$) | 0.05 weight percent |
| hematite ($Fe_2O_3$) | 0.05 weight percent |
| calcia ($CaO$) | 0.05 weight percent, and |
| magnesia ($MgO$) | 0.05 weight percent. |

In a preferred embodiment, the limits for known impurities are about:

| | |
|---|---|
| $Na_2O$ | 0.01 weight percent |
| $SiO_2$ | 0.01 weight percent |
| $Al_2O_3$ | 0.01 weight percent |
| $TiO_2$ | 0.01 weight percent |
| $Fe_2O_3$ | 0.01 weight percent |
| $CaO$ | 0.025 weight percent, and |
| $MgO$ | 0.025 weight percent. |

The impurity limits in the embodiments above are not indicative that any or all of the impurities listed will be included in the material in any amount. The embodiment of the invention may include zero weight percent of one or more of the above-listed impurities.

Figure 3:
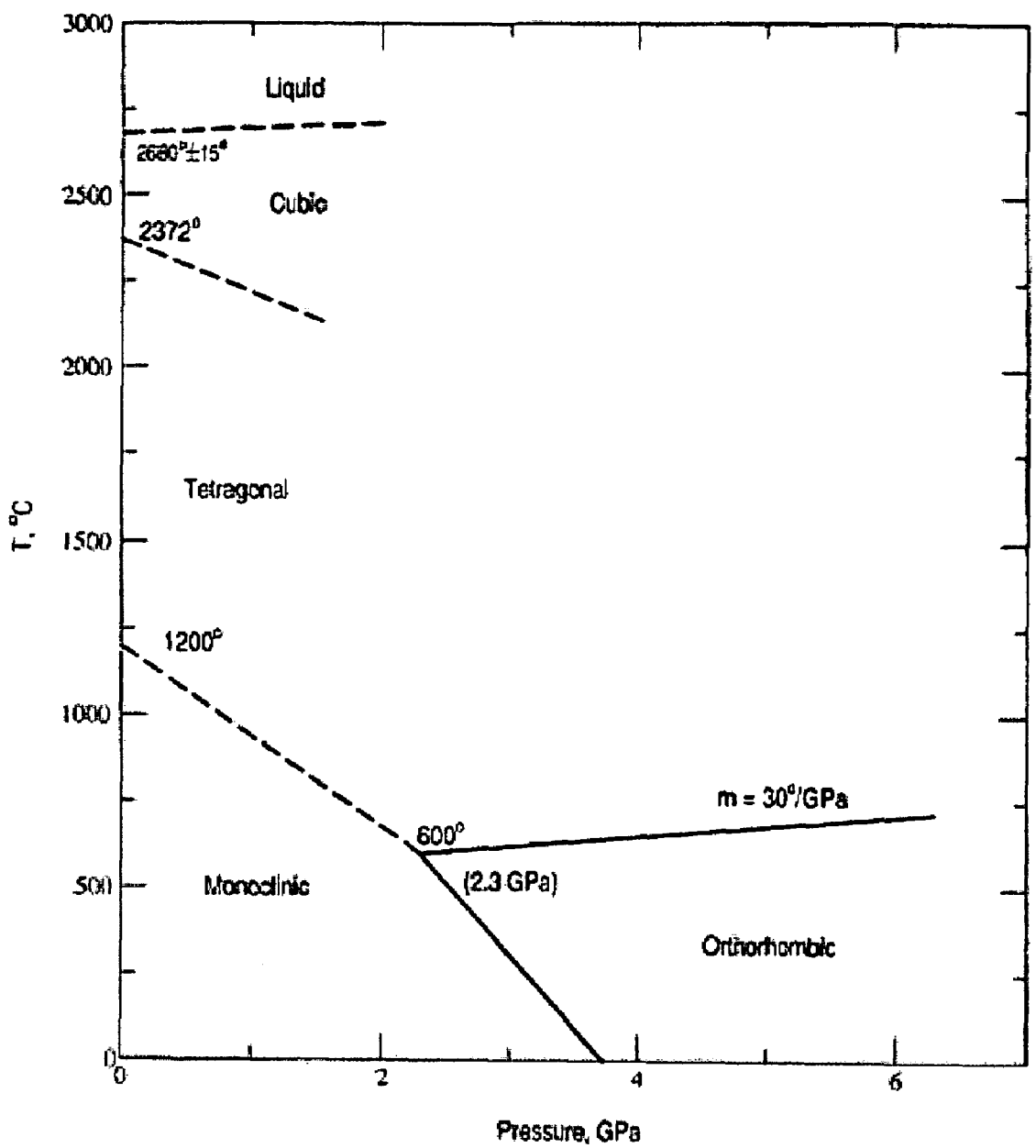
FIG. 3 provides a phase diagram for $ZrO_2$.

FIG. 3 provides a phase diagram for pure zirconia. (The diagram can be found, for example, in Ceramic Phase Diagrams vol. 3, figure 04259.) As shown in FIG. 3, pure zirconia exists in three crystal phases at different temperatures. At very high temperatures (>2370° C.) the material has a cubic structure. At intermediate temperatures (1200 to 2372° C.) it has a tetragonal structure. At relatively lower temperatures (below 1200° C.) the material transforms to the monoclinic structure. The transformation from tetragonal to monoclinic is rapid and is accompanied by a 3 to 5 percent volume increase that causes extensive stress in the material. Thus, pure zirconia cannot fulfill the coating requirements for high-temperature cycling. The resulting strain difference between the coating and substrate caused by the phase transformation results in a stress that is greater than the bond strength between them, so the coating will detach.

In accordance with embodiments of the invention, in order to overcome the volume change caused by the undesired phase transformation described above, one or more elements are added to the zirconia to modify the amount of phase transformation that occurs. The stabilizing elements, which are suitable for changing the amount and rate of phase transformation that occurs in the oxide coating, may include the following: scandium, yttrium and the rare earths, particularly the lanthanides, since they have solubility in zirconia. Scandium is not typically used due to its rarity and resulting prohibitive cost. Use of rare earths metals from the actinide group such as uranium and thorium may be limited due to their radioactivity. Thus, yttrium is a preferred stabilizing element.

Figure 4:
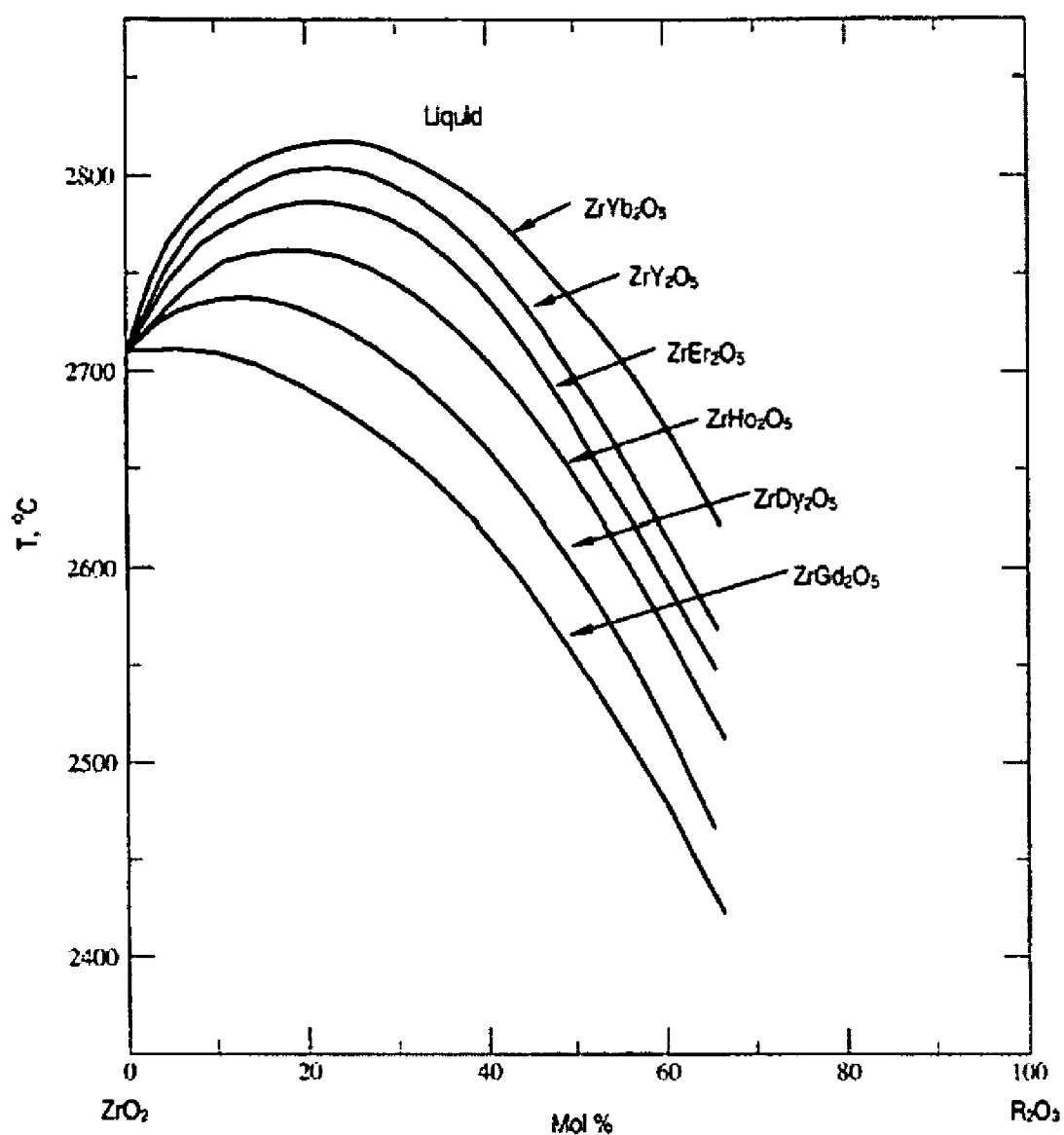
FIG. 4 provides a standard phase diagram for stabilized $ZrO_2$ showing the general alloying trends for various stabilizers [Ceramic Phase Diagram, Volume 4, Fig 05241]
Figure 5:
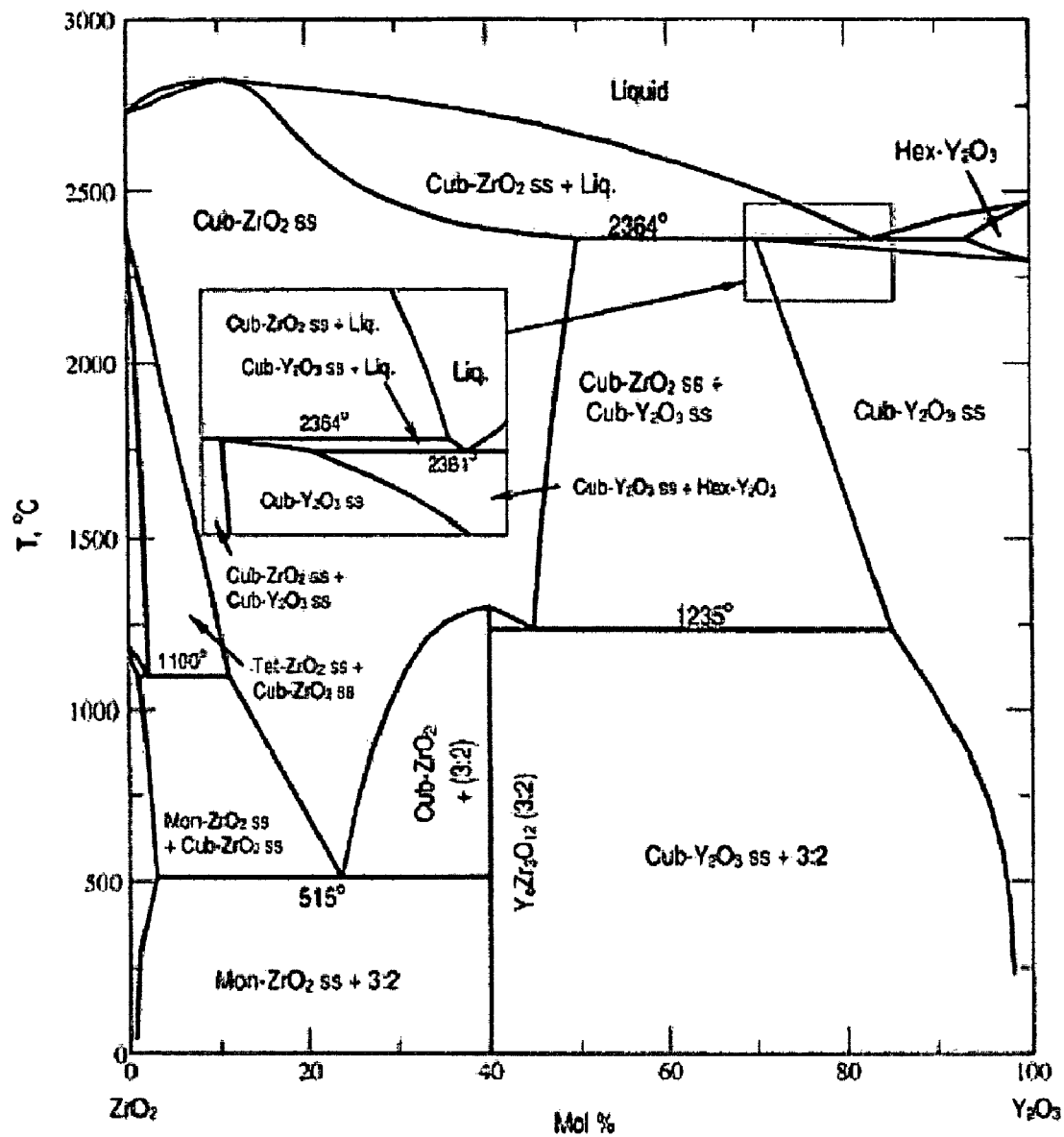
FIG. 5 provides a phase diagram for $ZrO_2$ with stabilizer.

FIG. 4 provides a standard phase diagram for stabilized zirconia showing the general alloying trends for the zirconia stabilizers. A specific diagram for zirconia with yttria as a stabilizer is given in FIG. 5. (The diagram can be found, for example, in Ceramic Phase Diagram, vol. Zirconia, figure Zr-157.)

Phase transformation in partially stabilized zirconia may possibly cause localized stresses that lead to the formation of micron-sized micro-cracks in the coating upon thermal cycling that cancel out some of the massive stress caused by coating volume shrinkage. Thus, these two phenomena of the coating structure—shrinking and cracking—work against each other and finding a balance between them will maximize coating lifetime. This mechanism implies then that the structure of the crack network of the coating is changing with time as the phase of the ceramic material changes. This mechanism is required for a thermal barrier or high temperature abradable coatings to survive thermal cycling.

The addition of a stabilizing element affects two main properties of the zirconia coating system in a positive manner. First, the addition of a stabilizer as illustrated in FIG. 4 generally increases the melting temperature of the zirconia (in the partially stabilized composition ranges). Second, the addition of a stabilizer generally decreases the thermal conductivity. Once the critical composition that has the highest thermal cycling values is found experimentally for a stabilizer, the stabilizers can be compared by the melting point at the critical composition.

Rising fuel cost and other factors continue to drive the need for improved operational efficiency, and thus higher operating temperatures, of gas turbines. While yttria stabilized zirconia is the material of choice for stabilization, greater operational temperatures can be achieved using ytterbia (FIG. 4) for example. Zirconia partially stabilized by ytterbia provides a better composition, since it also has one of the lowest thermal conductivities of the potential stabilizers when alloyed with zirconia. As the need for higher operating temperatures increases, a higher coating material cost may be tolerated, so ytterbia partially stabilized zirconia may become a preferred thermal barrier or high temperature abradable coating system. Given then the trade-offs of cost and performance, a combination of both yttria and ytterbia stabilizers is expected to have optimum performance to cost ratio.

A blend of two or more partially stabilized high-purity material compositions may also be used. For example, in another embodiment, a blended ceramic material for use in high-temperature thermal barriers is provided. The blended materials include a first material with a yttria ($Y_2O_3$) stabilizer, and a balance of at least one of zirconia ($ZrO_2$) and hafnia ($HfO_2$) and combinations thereof, wherein the zirconia ($ZrO_2$) and/or hafnia ($HfO_2$) is partially stabilized by the yttria stabilizer, and having total impurities less than or equal to 0.15 weight percent, and preferably less than or equal to 0.1 weight percent. The range of $Y_2O_3$ stabilizer is about 4-12 weight percent, and preferably 6-9 weight percent. The second material of the blended material may contain a ytterbia ($Yb_2O_5$) stabilizer and a balance of at least one of zirconia ($ZrO_2$) and hafnia ($HfO_2$) and combinations thereof, wherein the zirconia ($ZrO_2$) and/or hafnia ($HfO_2$) is partially stabilized by the ytterbia stabilizer, and having total impurities less than or equal to 0.15 weight percent, and preferably less than or equal to 0.1 weight percent. The range of $Yb_2O_5$ stabilizer is about 4-16 weight percent, and preferably 10-16 weight percent. In the blended material, the ytterbia ($Yb_2O_5$) stabilized zirconia ($ZrO_2$) and/or hafnia ($HfO_2$) fraction may include about 5-50 weight percent of the total and preferably about 15-30 weight percent of the total. The yttria stabilized zirconia ($ZrO_2$) and/or hafnia ($HfO_2$) fraction may include about 50-95 weight percent of the total and preferably about 70-85 weight percent of the total blend.

In another embodiment the blended material includes a first material with a ytterbia ($Yb_2O_5$) stabilizer, and a balance of at least one of zirconia ($ZrO_2$) and hafnia ($HfO_2$) and combinations thereof, wherein the zirconia ($ZrO_2$) and/or hafnia ($HfO_2$) is partially stabilized by the ytterbia stabilizer, and having total impurities less than or equal to 0.15 weight percent, and preferably less than or equal to 0.1 weight percent. The range of $Yb_2O_5$ stabilizer is about 4-16 weight percent, and preferably 10-16 weight percent. The second material of the blended material may contain a stabilizer of at least one of neodymium ($Nd_2O_3$), europia ($Eu_2O_5$), and combinations thereof and a balance of at least one of zirconia ($ZrO_2$) and hafnia ($HfO_2$) and combinations thereof, wherein the balance is partially stabilized by the stabilizer, and having total impurities less than or equal to 0.15 weight percent, and preferably less than or equal to 0.1 weight percent. The range of $Nd_2O_3$ stabilizer is about 4-20 weight percent, and preferably 8-16 weight percent. The range of $Eu_2O_3$ stabilizer is about 4-16 weight percent, and preferably 10-16 weight percent. The range of the combined $Nd_2O_3$ and $Eu_2O_3$ stabilizer is about 4-16 weight percent. In the blended material, the ytterbia ($Y_2O_3$) stabilized zirconia ($ZrO_2$) and/or hafnia ($HfO_2$) fraction may include about 5-50 weight percent of the total and preferably about 15-30 weight percent of the total. The yttria stabilized zirconia ($ZrO_2$) and/or hafnia ($HfO_2$) fraction may include about 50-95 weight percent of the total and preferably about 70-85 weight percent of the total blend.

In another embodiment of the invention the blended material includes a first material with a yttria ($Y_2O_3$) stabilizer, and a balance of at least one of zirconia ($ZrO_2$) and hafnia ($HfO_2$) and combinations thereof, wherein the zirconia ($ZrO_2$) and/or hafnia ($HfO_2$) is partially stabilized by the yttria stabilizer, and having total impurities less than or equal to 0.15 weight percent, and preferably less than or equal to 0.1 weight percent. The range of $Y_2O_3$ stabilizer is about 4-12 weight percent, and preferably 6-9 weight percent. The second material of the blended material may contain a stabilizer of at least one of neodymium ($Nd_2O_3$), europia ($Eu_2O_5$), and combinations thereof and a balance of at least one of zirconia ($ZrO_2$) and hafnia ($HfO_2$) and combinations thereof, wherein the balance is partially stabilized by the stabilizer, and having total impurities less than or equal to 0.15 weight percent, and preferably less than or equal to 0.1 weight percent. The range of $Nd_2O_3$ stabilizer is about 4-20 weight percent, and preferably 8-16 weight percent. The range of $Eu_2O_3$ stabilizer is about 4-16 weight percent, and preferably 10-16 weight percent. The range of the combined $Nd_2O_3$ and $Eu_2O_3$ stabilizer is about 4-16 weight percent. In the blended material, the neodymium ($Nd_2O_3$) and/or europia ($Eu_2O_5$) stabilized zirconia ($ZrO_2$) and/or hafnia ($HfO_2$) fraction may include about 5-50 weight percent of the total and preferably about 15-30 weight percent of the total. The yttria stabilized zirconia ($ZrO_2$) and/or hafnia ($HfO_2$) fraction may include about 50-95 weight percent of the total and preferably about 70-85 weight percent of the total blend.

In a further embodiment of the invention the blended material includes a blend of at least three materials. The first material may contain a yttria ($Y_2O_3$) stabilizer, and a balance of at least one of zirconia ($ZrO_2$) and hafnia ($HfO_2$) and combinations thereof, wherein the zirconia ($ZrO_2$) and/or hafnia ($HfO_2$) is partially stabilized by the yttria stabilizer, and having total impurities less than or equal to 0.15 weight percent, and preferably less than or equal to 0.1 weight percent. The range of $Y_2O_3$ stabilizer is about 4-12 weight percent, and preferably 6-9 weight percent. The second material of the blend may contain a ytterbia ($Yb_2O_5$) stabilizer, and a balance of at least one of zirconia ($ZrO_2$) and hafnia ($HfO_2$) and combinations thereof, wherein the zirconia ($ZrO_2$) and/or hafnia ($HfO_2$) is partially stabilized by the ytterbia stabilizer, and having total impurities less than or equal to 0.15 weight percent, and preferably less than or equal to 0.1 weight percent. The range of $Yb_2O_5$ stabilizer is about 4-16 weight percent, and preferably 10-16 weight percent. The third material of the blend may contain a stabilizer of at least one of neodymium ($Nd_2O_3$), europia ($Eu_2O_5$), and combinations thereof and a balance of at least one of zirconia ($ZrO_2$) and hafnia ($HfO_2$) and combinations thereof, wherein the balance is partially stabilized by the stabilizer, and having total impurities less than or equal to 0.15 weight percent, and preferably less than or equal to 0.1 weight percent. The range of $Nd_2O_3$ stabilizer is about 4-20 weight percent, and preferably 8-16 weight percent. The range of $Eu_2O_3$ stabilizer is about 4-16 weight percent, and preferably 10-16 weight percent. The range of the combined $Nd_2O_3$ and $Eu_2O_3$ stabilizer is about 4-16 weight percent. In the blended material, the ytterbia ($Y_2O_3$) stabilized zirconia ($ZrO_2$) and/or hafnia ($HfO_2$) fraction may include about 5-45 weight percent of the total, and preferably about 15-30 weight percent of the total. The neodymium ($Nd_2O_3$) and/or europia ($Eu_2O_5$) stabilized zirconia ($ZrO_2$) and/or hafnia ($HfO_2$) fraction may also include about 5-45 weight percent of the total and preferably about 15-30 weight percent of the total. The yttria stabilized zirconia ($ZrO_2$) and/or hafnia ($HfO_2$) fraction may include about 10-90 weight percent of the total, and preferably about 30-60 weight percent of the total blend.

Material of embodiments of the present invention can be provided in a variety of forms for use in thermal spray applications. For example, the material is supplied in the form of a powder, a slurry of powder, or a chemical solution of the constituents. If in powder form, the powder may be in the form of a spray dried powder of the individual constituents and organic binder, spray dried powder of the combined individual constituents and organic binder, fused and crushed powder, agglomerated and sintered powder, plasma densified material or powder from chemical solution routes. Typical particle sizes for the powders may vary but typically range between about 5-150 microns when deposited by various thermal spray equipment, preferably ranging between about 15-125 microns for air plasma spray and ranging between about 5-30 microns for low pressure plasma spray.

Typically for thermal spray applications, a polymer or organic material in powder form can be added to the material blend. Powder may be in the form of a spray dried powder of the individual constituents and an organic binder, spray dried powder of the combined individual constituents and an organic binder, fused and crushed powder, agglomerated and sintered powder, plasma densified material or powder from chemical solution routes. The organic binder may be used to at least partially bond together the placeholder material and the ceramic material. For high temperature abradable coatings, the benefit of adding a fugitive phase is that a higher porosity than is achievable with conventional deposition methods. The increased porosity aids abradability by introducing more surfaces to the crack network of the coating, decreasing the coating elastic modulus and thus promoting controlled material removal. Thus, according to an embodiment of the invention, a coating material may have about 70 to 99 weight percent of an ultra-pure ceramic material as previously described and about 1-30 weight percent (and preferably 2-15 weight percent) of a placeholder material. The placeholder material may be an organic powder material or an inorganic powder material that can be burned out subsequent to deposition of the coating material.

While exemplary embodiments of the invention have been shown and described herein, it will be obvious to those skilled in the art that such embodiments are provided by way of example only. Numerous insubstantial variations, changes, and substitutions will now be apparent to those skilled in the art without departing from the scope of the invention disclosed herein by the Applicants. Accordingly, it is intended that the invention be limited only by the spirit and scope of the claims, as they will be allowed.

We claim:

1. A ceramic material for use in high-temperature thermal barriers or abradable seal coatings,
    the ceramic material is supplied in a form for thermal spray applications and comprises:
    about 4 to 20 weight percent of a stabilizer of one or more rare earth oxides; and
    a balance of at least one of zirconia ($ZrO_2$), hafnia ($HfO_2$) and combinations thereof,
    wherein the zirconia ($ZrO_2$) and/or hafnia ($HfO_2$) is partially stabilized by the stabilizer,
    wherein the total amount of impurities is less than or equal to 0.15 weight percent, and
    wherein the amount of oxide impurities is less than or equal to:
        about 0.01 weight percent soda,
        about 0.01 weight percent silica,
        about 0.01 weight percent alumina,
        about 0.01 weight percent titania,
        about 0.01 weight percent hematite,
        about 0.025 weight percent calcia, and
        about 0.025 weight percent magnesia.

2. The ceramic material of claim 1, wherein the stabilizer is about 4-12 weight percent yttria.

3. The ceramic material of claim 1, wherein the stabilizer is about 6-9 weight percent yttria.

4. The ceramic material of claim 1, wherein the material is supplied in the form of a chemical solution.

5. The ceramic material of claim 1, wherein the material is supplied in the form of one of a powder or a slurry of partially stabilized powder.

6. The ceramic material of claim 5, wherein the powder is a spray dried powder of the individual constituents with an organic binder, a spray dried powder of the combined constituents with organic binder, a fused and crushed powder, an agglomerated and sintered powder, a plasma densified material, or powder made from a chemical solution.

7. The ceramic material of claim 5, wherein the powder material has a particle size of about 5-150 microns.

8. The ceramic material of claim 1, wherein the total amount of impurities is less than or equal to 0.10 weight percent.

9. The ceramic material of claim 1, wherein the ceramic material is part of a blended ceramic material for use in high-temperature thermal barriers or abradable seal coatings, the blended ceramic material being supplied in the form of one of a powder or a slurry of partially stabilized powder.

10. The ceramic material of claim 9, wherein the blended material includes a placeholder.

11. The ceramic material of claim 10, wherein the one or more ceramic materials comprises about 70-99 weight percent of the blended material and the placeholder comprises about 1-30 weight percent of the blended material.

12. The ceramic material of claim 1, wherein the stabilizer is about 10-16 weight percent ytterbia.

13. The ceramic material of claim 1, wherein the stabilizer is about 4-16 weight percent of a combination of yttria and ytterbia.

14. The ceramic material of claim 1, wherein the stabilizer is about 4-16 weight percent dysprosia.

15. The ceramic material of claim 1, wherein the stabilizer is neodymia or europia or combinations thereof.

16. The ceramic material of claim 1, wherein the total stabilizer is 4-16 weight percent and includes a primary stabilizer of yttria and/or ytterbia and a secondary stabilizer of one or more other rare earth oxides.

17. The ceramic material of claim 1, wherein the total stabilizer is 4-16 weight percent and includes a primary stabilizer of dysprosia and a secondary stabilizer of one or more other rare earth oxides.

18. The ceramic material of claim 1, wherein the total stabilizer is 4-20 weight percent and includes a primary stabilizer of yttria and/or ytterbia and a secondary stabilizer of neodymia and/or europia and combinations thereof.

* * * * *